(12) United States Patent
Yang

(10) Patent No.: US 10,930,520 B2
(45) Date of Patent: Feb. 23, 2021

(54) SELF-FORMED LINER FOR INTERCONNECT STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/377,975

(22) Filed: Apr. 8, 2019

(65) Prior Publication Data

US 2019/0237340 A1    Aug. 1, 2019

Related U.S. Application Data

(60) Continuation of application No. 15/651,656, filed on Jul. 17, 2017, now Pat. No. 10,304,695, which is a
(Continued)

(51) Int. Cl.
*H01L 21/00* (2006.01)
*H01L 21/3213* (2006.01)
*H01L 23/532* (2006.01)
*H01L 21/02* (2006.01)
*H01L 21/768* (2006.01)

(52) U.S. Cl.
CPC .. *H01L 21/32134* (2013.01); *H01L 21/02247* (2013.01); *H01L 21/32136* (2013.01); *H01L 21/76826* (2013.01); *H01L 21/76831* (2013.01); *H01L 21/76843* (2013.01); *H01L 21/76846* (2013.01); *H01L 21/76855* (2013.01); *H01L 23/53223* (2013.01); *H01L 23/53238* (2013.01); *H01L 21/02252* (2013.01); *H01L 21/02255* (2013.01); *H01L 2221/1036* (2013.01)

(58) Field of Classification Search
CPC ......... H01L 21/32134; H01L 21/02247; H01L 21/32136; H01L 21/76826; H01L 21/76831; H01L 21/76843; H01L 21/76846; H01L 21/76855
See application file for complete search history.

(56) References Cited

U.S. PATENT DOCUMENTS

| 4,621,277 A | 11/1986 | Ito et al. |
| 5,393,702 A | 2/1995 | Yang et al. |

(Continued)

OTHER PUBLICATIONS

List of IBM Patents or Patent Applications Treated as Related Dated Apr. 8, 2019, 2 Pages.

*Primary Examiner* — Richard A Booth
(74) *Attorney, Agent, or Firm* — Scully, Scott, Murphy & Presser, P.C; L. Jeffrey Kelly, Esq.

(57) ABSTRACT

An interconnect dielectric material having an opening formed therein is first provided. A surface nitridation process is then performed to form a nitridized dielectric surface layer within the interconnect dielectric material. A metal layer is formed on the nitridized dielectric surface layer and then an anneal is performed to form a metal nitride layer between the metal layer and the nitridized dielectric surface layer. A portion of the originally deposited metal layer that is not reacted with the nitridized dielectric surface is then selectively removed and thereafter an electrical conducting structure is formed directly on the metal nitride layer that is present in the opening.

18 Claims, 4 Drawing Sheets

Related U.S. Application Data division of application No. 15/287,407, filed on Oct. 6, 2016, now Pat. No. 9,721,895.

(56) References Cited

U.S. PATENT DOCUMENTS

| | | | |
|---|---|---|---|
| 5,895,268 | A | 4/1999 | Mathews |
| 6,180,481 | B1 | 1/2001 | Deboer et al. |
| 6,491,978 | B1 | 12/2002 | Kalyanam |
| 6,528,180 | B1 | 3/2003 | Lee et al. |
| 6,680,538 | B2 | 1/2004 | Kim et al. |
| 6,736,701 | B1 | 5/2004 | Jang et al. |
| 6,783,868 | B2 | 8/2004 | Ciotti et al. |
| 6,910,947 | B2 | 6/2005 | Paik |
| 6,913,938 | B2 | 7/2005 | Shanmugasendram et al. |
| 6,919,636 | B1 | 7/2005 | Ryan |
| 6,936,843 | B2 | 8/2005 | Cui |
| 6,950,716 | B2 | 9/2005 | Ward et al. |
| 6,952,052 | B1 | 10/2005 | Marathe et al. |
| 6,961,626 | B1 | 11/2005 | Paik |
| 6,984,198 | B2 | 1/2006 | Krishnamurthy et al. |
| 6,999,836 | B2 | 2/2006 | Schwarm et al. |
| 7,040,956 | B2 | 5/2006 | Paik |
| 7,069,101 | B1 | 6/2006 | Arackaparambil et al. |
| 7,082,345 | B2 | 7/2006 | Shanmugasendram et al. |
| 7,272,459 | B2 | 9/2007 | Kokotov et al. |
| 7,333,871 | B2 | 2/2008 | Schwarm |
| 7,337,019 | B2 | 2/2008 | Reiss et al. |
| 7,349,753 | B2 | 3/2008 | Paik |
| 7,354,332 | B2 | 4/2008 | Surana et al. |
| 2003/0127427 | A1* | 7/2003 | Yuan ................ C03C 15/00 216/63 |
| 2010/0219533 | A1 | 9/2010 | Ootake et al. |

* cited by examiner

SELF-FORMED LINER FOR INTERCONNECT STRUCTURES

BACKGROUND

The present application relates to a semiconductor structure and a method of forming the same. More particularly, the present application relates to an interconnect structure containing a self-formed metal nitride liner located on a nitrogen-enriched dielectric surface of an interconnect dielectric material layer as well as a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., electrical conducting structures) in a dielectric material having a dielectric constant of less than 4.0.

With the continual scaling of the feature sizes, the volume fraction occupied by a metal liner within an opening used to accommodate an electrical conducting structure dramatically increases and degrades the circuit performance. There is thus a need for providing a method to maximize the electrical conducting structure volume fraction by eliminating or reducing the metal liner from the opening.

SUMMARY

An interconnect dielectric material having an opening formed therein is first provided. A surface nitridation process is then performed to form a nitridized dielectric surface layer within the interconnect dielectric material. A metal layer is formed on the nitridized dielectric surface layer and then an anneal is performed to form a metal nitride layer between the metal layer and the nitridized dielectric surface layer. A portion of the originally deposited metal layer that is not reacted with the nitridized dielectric surface is then selectively removed and thereafter an electrical conducting structure is formed directly on the metal nitride layer that is present in the opening.

One aspect of the present application relates to a semiconductor structure. In one embodiment of the present application, the semiconductor structure includes an interconnect dielectric material layer containing an opening that exposes a nitridized dielectric surface of the interconnect dielectric material layer. A metal nitride liner is located in the opening and is directly contacting the nitridized dielectric surface of the interconnect dielectric material layer. An electrical conducting structure is also located in the opening and is directly contacting the metal nitride liner.

In another embodiment of the present application, the semiconductor structure may include a first interconnect dielectric material layer of a first nitrogen content and containing a first opening that exposes a first nitridized dielectric surface of the first interconnect dielectric material layer, the first nitridized dielectric surface having a higher nitrogen content than the first nitrogen content of the first dielectric material layer. A second interconnect dielectric material layer of a second nitrogen content that differs from the first nitrogen content is located on a surface of the first dielectric material layer, the second interconnect dielectric layer contains a second opening that is in communication with the first opening and that exposes a second nitridized dielectric surface of the second interconnect dielectric material layer, the second nitridized dielectric surface has a higher nitrogen content than the second nitrogen content of the second dielectric material layer. A first metal nitride liner is located in the first opening and directly contacting the first nitridized dielectric surface, and a second metal nitride liner is located in the second opening and directly contacting the second nitridized dielectric surface. An electrical conducting structure is present in the first and second openings, wherein a lower portion of the electrical conducting structure is in the first opening and directly contacting the first metal nitride liner, and an upper portion of the electrical conducting structure is in the second opening and directly contacting the second metal nitride liner. Due to the difference in nitrogen content in the original interconnect dielectric material layers, the first and second metal nitride liners have different thicknesses.

Another aspect of the present application relates to a method of forming a semiconductor structure. In one embodiment, the method may include providing an opening in an interconnect dielectric material layer. Next, a nitridized dielectric surface layer is formed within exposed portions of the interconnect dielectric material layer. A metal layer is then formed on the nitridized dielectric surface layer. Next, the interconnect dielectric material layer containing the nitridized dielectric surface layer and the metal layer is anneal to provide a metal nitride layer between the nitridized dielectric surface layer and a remaining portion of the metal layer. After annealing, the remaining portion of the metal layer is selectively removed and an electrical conducting structure is formed in the opening and on the metal nitride layer.

DETAILED DESCRIPTION

Figure 1:
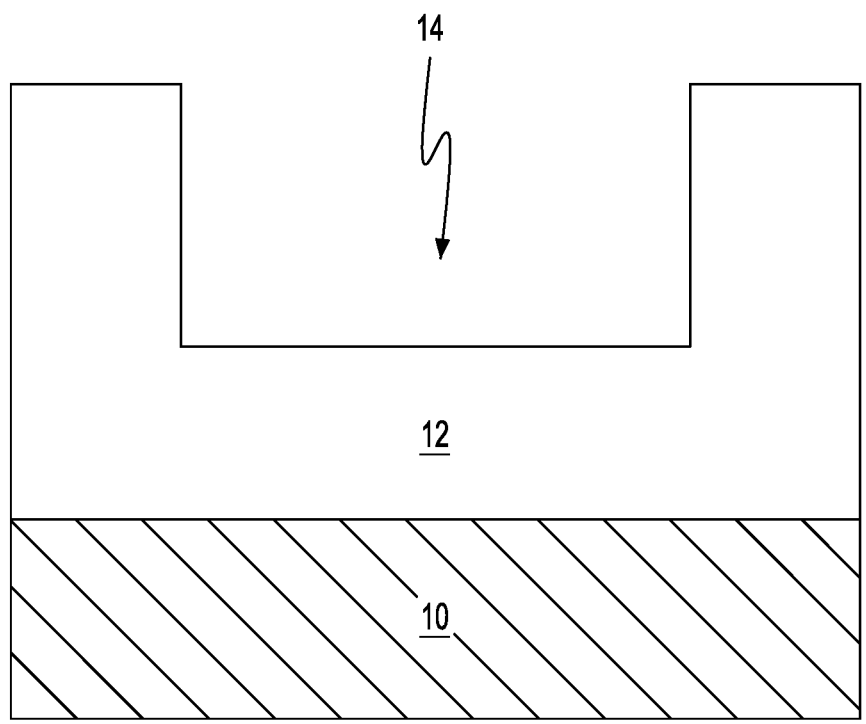
FIG. 1 is a cross sectional view of an exemplary semiconductor structure in which at least one opening is present in an interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure that can be employed in accordance with an embodiment of the present application. The exemplary semiconductor structure shown in FIG. 1 includes an interconnect dielectric material layer 12 that is present on a surface of a substrate 10. At least one opening 14 is present in the interconnect dielectric material layer 12.

The substrate 10 may be composed of a semiconductor material, an insulator material, a conductive material or any combination thereof. When the substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, the substrate 10 can be a layered semiconductor such as, for example, Si/SiGe, Si/SiC, silicon-on-insulators (SOIs) or silicon germanium-on-insulators (SGOIs). When the substrate 10 is composed of a semiconductor material, one or more semiconductor devices such as, for example, complementary metal oxide semiconductor (CMOS) devices can be fabricated thereon.

When the substrate 10 is an insulator material, the insulator material can be an organic insulator, an inorganic insulator or any combination thereof including multilayers. When the substrate 10 is a conductive material, the substrate 10 may include, for example, polySi, an elemental metal, alloys of elemental metals, a metal silicide, a metal nitride or any combination thereof including multilayers. When the substrate 10 is composed of a combination of an insulator material and a conductive material, the substrate 10 may represent an underlying interconnect level of a multilayered interconnect structure.

The interconnect dielectric material layer 12 that is employed may be composed of any interlevel or intralevel dielectric including inorganic dielectrics or organic dielectrics. In some embodiments, the interconnect dielectric material layer 12 may be composed of a single dielectric material. In other embodiments, the interconnect dielectric material layer 12 may be composed of at least two different dielectric materials. In one embodiment, the interconnect dielectric material layer 12 may be non-porous. In another embodiment, the interconnect dielectric material layer 12 may be porous. Some examples of suitable dielectrics that can be used as the interconnect dielectric material layer 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 12 may vary depending upon the type of dielectric material(s) used. In one example, the interconnect dielectric material layer 12 may have a thickness from 50 nm to 1000 nm. Other thicknesses that are lesser than, or greater than, the aforementioned thickness range may also be employed in the present application for the thickness of the interconnect dielectric material layer 12.

As stated above, at least one opening 14 is present in the interconnect dielectric material layer 12. In one embodiment (and as shown), the at least opening 14 is formed partially into the interconnect dielectric material layer 14 so as to expose a sub-surface portion of the interconnect dielectric material layer 14. By "sub-surface" it is meant a surface of a material layer that is present between a topmost surface of the material and a bottommost surface of the material. In another embodiment (not shown), the at least one opening is formed entirely through the interconnect dielectric material layer 12.

The at least one opening 14 that is formed into the interconnect dielectric material layer 12 can be formed utilizing a patterning process. In one embodiment, the patterning process may include lithography and etching. The lithographic process includes forming a photoresist (not shown) atop a material or material stack to be patterned (i.e., the interconnect dielectric material layer 12), exposing the photoresist to a desired pattern of radiation and developing the exposed photoresist utilizing a conventional resist developer. The photoresist may be a positive-tone photoresist, a negative-tone photoresist or a hybrid-tone photoresist. In some embodiments, a hard mask such as, for example, a layer of silicon dioxide and/or silicon nitride, can be interposed between the photoresist and the interconnect dielectric material layer 12. The etching process includes a dry etching process (such as, for example, reactive ion etching, ion beam etching, plasma etching or laser ablation), and/or a wet chemical etching process. Typically, reactive ion etching is used in providing the at least one opening 14 into at least the interconnect dielectric material layer 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying interconnect dielectric material layer 12. When a hard mask is employed, the hard mask is removed after the patterning process utilizing a planarization process or etching.

The depth of the at least one opening 14 that is formed into the interconnect dielectric material layer 12 (measured from the topmost surface of the interconnect dielectric material layer 12 to the bottom wall of the at least one opening 14) may vary. The at least one opening 14 that is formed into the interconnect dielectric material layer 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening 14 is shown as a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Figure 2:
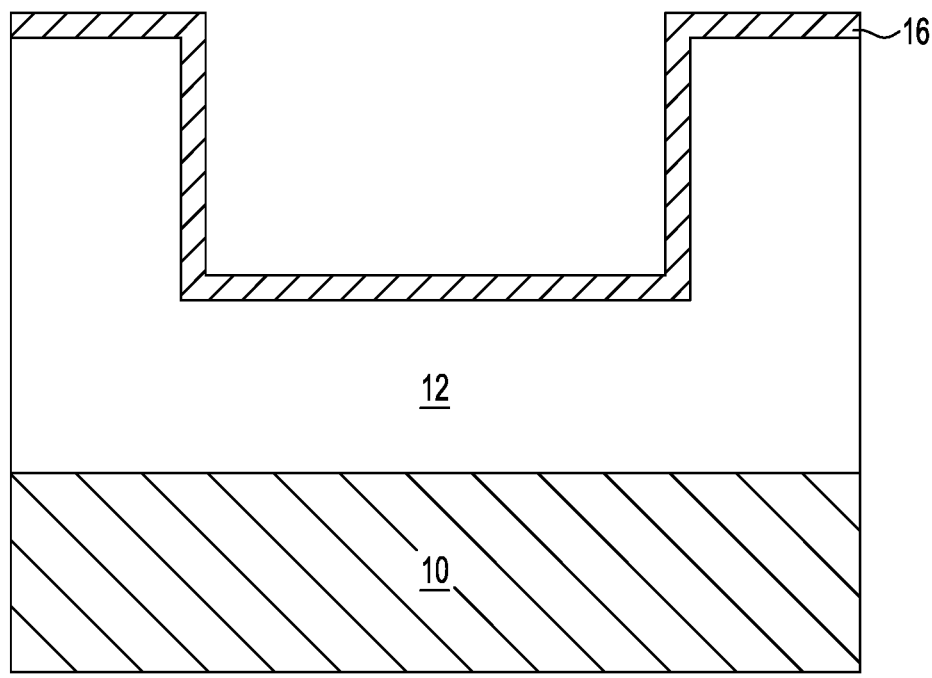
FIG. 2 is a cross sectional view of the exemplary semiconductor structure of FIG. 1 after performing a surface nitridation process to provide a nitridized dielectric surface layer within the interconnect dielectric material layer.

Referring now to FIG. 2, there is illustrated the exemplary semiconductor structure of FIG. 1 after performing a surface nitridation process to provide a nitridized dielectric surface layer 16 within the interconnect dielectric material layer 12. In the illustrated embodiment, the nitridized dielectric surface layer 16 is formed within a topmost surface of the original interconnect dielectric layer 12 and within the sidewalls and bottom wall of the interconnect dielectric material 12 exposed by opening 14. The surface nitridation process may also be referred to herein as a nitride surface treatment process. The nitridized dielectric surface layer 16 may also be referred to herein as a nitrogen enriched dielectric surface layer. By "nitrogen enriched dielectric surface layer" it is meant, that the surfaces of the interconnect dielectric material layer 12 that are exposed to the surface nitridation process have a higher nitrogen content therein as compared to the originally deposited interconnect dielectric material layer 12. In some embodiments (and as shown), the nitridized dielectric surface layer 16 is a continuous layer. In other embodiments and when the opening 14 extends entirely through the interconnect dielectric material layer 12 (not shown), the nitridized dielectric surface layer 16 may be absent from the bottom wall of the opening.

In one embodiment, the surface nitridation process used in forming the nitridized dielectric surface layer 16 is a thermal nitridation process. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 450° C. In another embodiment, the thermal nitridation process employed in the present application is performed at a temperature from 100° C. to 300° C.

In addition to a thermal nitridation process, the formation of the nitridized dielectric surface layer 16 can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 450° C. In another embodiment, the plasma nitridation process employed in the present application is performed at a temperature from 100° C. to 300° C.

Notwithstanding the type of surface nitridation employed, the depth of the nitridized dielectric surface layer 16 may vary. Typically, the depth of the nitridized dielectric surface layer 16, as measured from the exposed surface of the interconnect dielectric material layer 12 inward, is from 0.5 nm to 20 nm, with a depth from 1 nm to 10 nm being more typical.

The nitridized dielectric surface layer 16 is composed of a same dielectric material as the interconnect dielectric material layer 12 with added nitrogen. In some embodiments, the nitrogen content (which is a combination of added nitrogen plus any nitrogen that may be present in the interconnect dielectric material layer 12) of the nitridized dielectric surface layer 16 is 10 atomic percent or greater. In one embodiment of the present application, the nitrogen content of the nitridized dielectric surface layer 16 can be from 10 atomic percent nitrogen to 50 atomic percent nitrogen. Nitrogen contents of less than 10 atomic percent are also contemplated. When the interconnect dielectric material layer 12 includes nitrogen, a nitrogen gradient may be formed between the nitridized dielectric surface layer 16 and the remaining portion of the interconnect dielectric material layer 12.

The thickness of the nitridized dielectric surface layer 16 is the same as the depth mentioned above. That is, the nitridized dielectric surface layer 16 may, for example, have a thickness from 0.5 nm to 20 nm.

Figure 3:
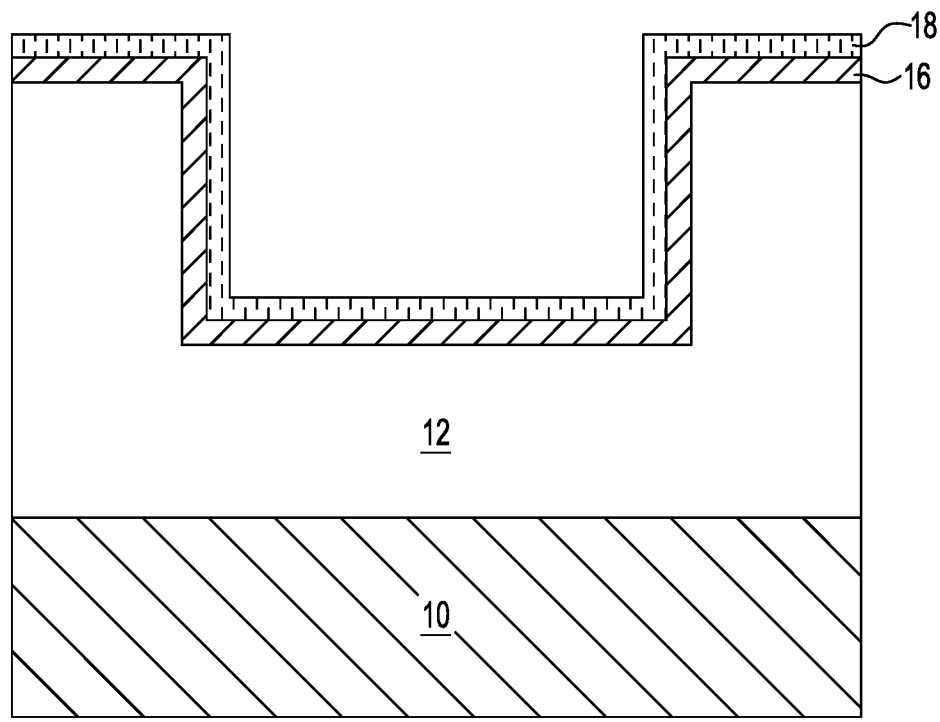
FIG. 3 is a cross sectional view of the exemplary semiconductor structure of FIG. 2 after forming a metal layer.

Referring now to FIG. 3, there is illustrated the exemplary semiconductor structure of FIG. 2 after forming a metal layer 18. The metal layer 18 is a continuous layer that is formed on the exposed surface of the nitridized dielectric surface layer 16. The metal layer 18 may be composed of Ta, Ti, W, Co, Ru, Ir, Al, Rh or any other metal that can form a metal nitride. The thickness of the metal layer 18 may vary depending on the deposition process used as well as the material employed. In some embodiments, the metal layer 18 may have a thickness from 1 nm to 50 nm; although other thicknesses for the metal layer 18 are contemplated and can be employed in the present application so long as the chosen thickness does not entirely fill the at least one opening 14 with the metal layer 18. The metal layer 18 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
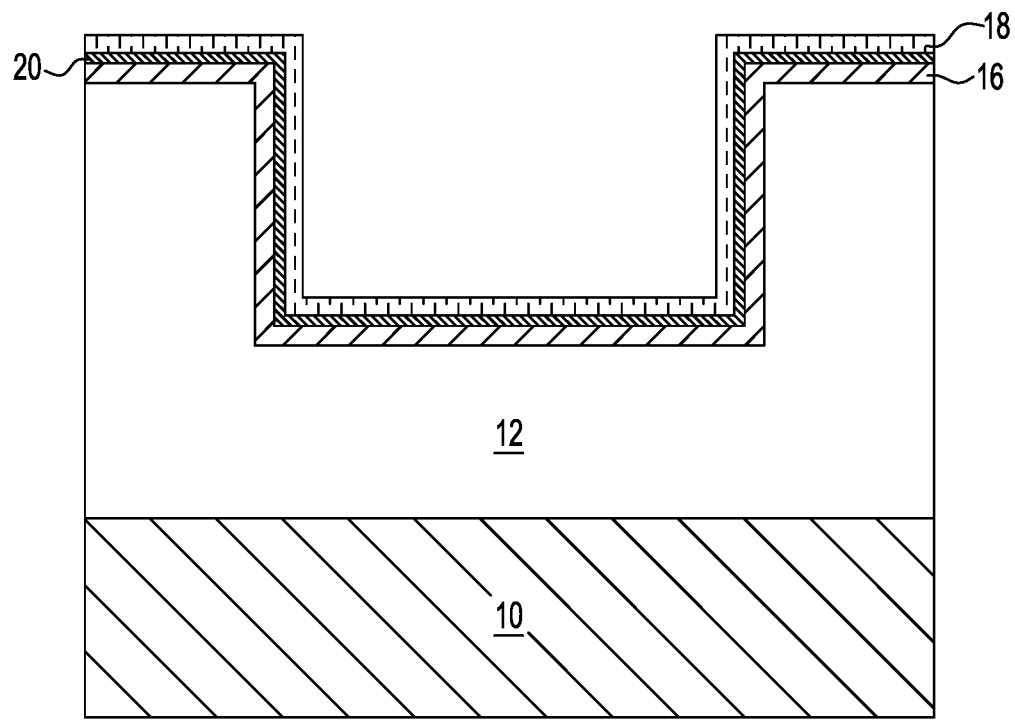
FIG. 4 is a cross sectional view of the exemplary semiconductor structure of FIG. 3 after performing an anneal to form a metal nitride layer between a remaining portion of the metal layer and the nitridized dielectric surface layer.

Referring now to FIG. 4, there is illustrated the exemplary semiconductor structure of FIG. 3 after performing an anneal to form a metal nitride layer 20 between a remaining portion of the metal layer 18 and the nitridized dielectric surface layer 16. The metal nitride layer 20 is formed by annealing the exemplary semiconductor structure shown in FIG. 3 to cause an in-situ reaction between the nitridized dielectric surface layer 16 and the metal layer 18. During this reaction, nitrogen diffuses from the nitridized dielectric surface layer 16 into the metal layer 18, and the diffused nitrogen reacts with the metal in the metal layer 18 to form the metal nitride layer 20. The nitridized dielectric surface layer 16, which may have a reduced nitrogen content after annealing, and a portion of the metal layer 18 remain as shown in FIG. 4. The thickness of the remaining portion of the metal layer 18 after the anneal is less than the original thickness of the metal layer 18. In some embodiments, the metal nitride layer 20 has a same nitrogen content as the nitridized dielectric surface layer 16. The metal nitride layer 20 is composed of a same metal as the metal layer 18.

In one embodiment, the annealing is a thermal anneal. The thermal anneal may be performed at a temperature of from 100° C. to 500° C. In one embodiment, the thermal anneal is performed in an inert gas ambient (i.e., one of Ar, Ne, and/or Xe). In another embodiment, the thermal anneal is performed in a forming gas ambient. The duration of the thermal anneal used in forming the metal nitride layer 20 can vary. In one example, and within the anneal temperature range mentioned above, the duration of the thermal anneal used in forming the metal nitride layer 20 can be from 10 minutes to 5 hours. The thermal anneal may include a rapid thermal anneal, and a furnace anneal. In some embodiments, the anneal may include a laser anneal. When a laser anneal is performed, the laser anneal may be performed at a temperature from 400° C. to 900° C. and for a duration of from 20 nanoseconds to 10 minutes. Other laser anneal temperatures and duration times are also contemplated for use in the present application.

Figure 5:
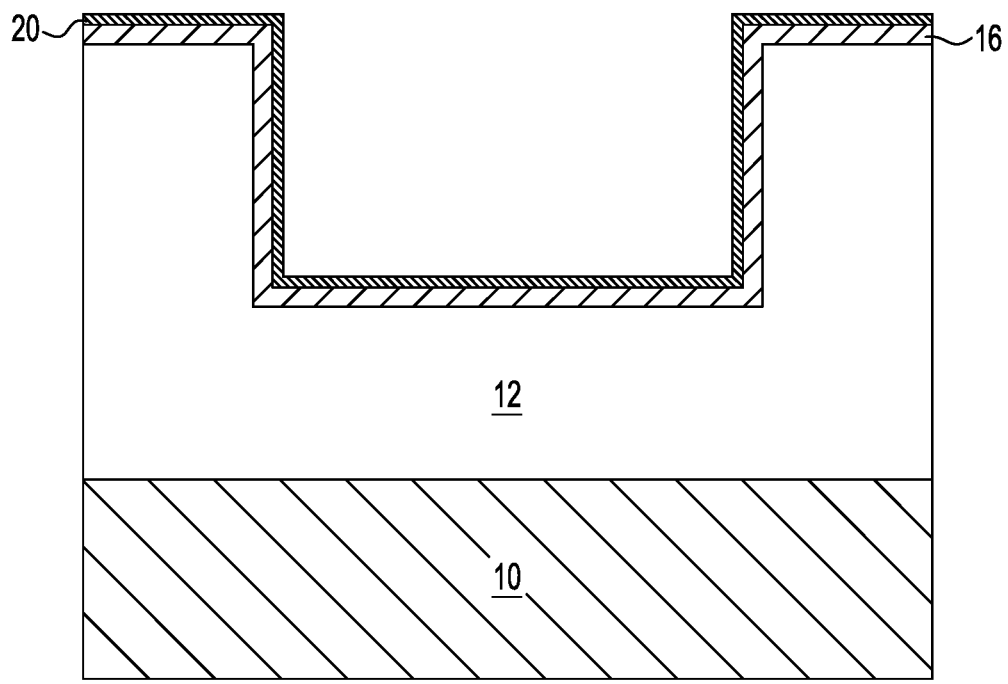
FIG. 5 is a cross sectional view of the exemplary semiconductor structure of FIG. 4 after selectively removing the remaining portion of the metal layer.

Referring now to FIG. 5, there is illustrated the exemplary semiconductor structure of FIG. 4 after selectively removing the remaining portion of the metal layer 18. The removal of the remaining portion of the metal layer 18 is performed utilizing an etching process that is selective in removing the remaining portion of the metal layer 18 relative to the metal nitride layer 20. In one embodiment of the present application, the remaining portion of the metal layer 18 can be removed utilizing a plasma etch. In one example, the plasma etch may include at least one chemical that contains fluorine or chlorine. In another embodiment of the present application, the remaining portion of the metal layer 18 may be removed utilizing a chemical wet etch process. In one example, an acid such as hydrogen fluoride, hydrogen chloride, sulfuric acid or nitride acid may be used to remove the remaining portion of the metal layer 18.

Figure 6:
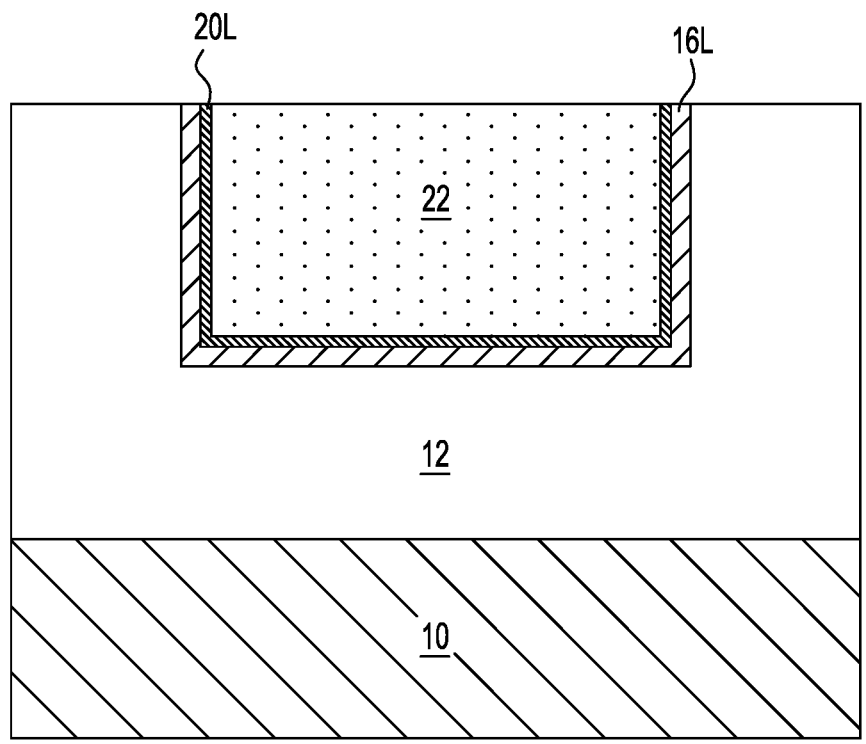
FIG. 6 is a cross sectional view of the exemplary semiconductor structure of FIG. 5 after forming a layer of a metal or metal alloy and thereafter performing a planarization process.

Referring now to FIG. 6, there is illustrated the exemplary semiconductor structure of FIG. 5 after forming a layer of a metal or metal alloy as an electrical conductor and thereafter performing a planarization process. The layer of metal or metal alloy that can be employed may include Cu, W, Al or alloys thereof such as, for example, a copper aluminum (Cu—Al) alloy or an aluminum copper (Al—Cu) alloy. The layer of metal or metal alloy may be formed by a deposition process including chemical vapor deposition (CVD), plasma enhanced chemical vapor deposition (PECVD), sputtering, chemical solution deposition or plating. In one example, a bottom-up plating process may be used in forming the layer metal or metal alloy. The layer of metal or metal alloy is formed upon the exposed surfaces of the metal nitride layer 20. The layer of metal or metal alloy fills the entirety of the remaining volume of the at least one opening 14 and forms above the topmost surface of the interconnect dielectric material layer 12.

Following the deposition of the layer metal or metal alloy, a planarization process such as, for example, chemical mechanical polishing (CMP) and/or grinding, can be used to provide the exemplary semiconductor structure shown in FIG. 6. The planarization process is a material removal process that removes all materials that are present outside the at least one opening 14 and above the topmost surface of the interconnect dielectric material layer 12. For example, the planarization removes a portion of the layer of metal or metal alloy, a portion of the metal nitride layer 20 and a portion of the nitridized dielectric surface layer 16 that are located outside each opening 14 and above the topmost surface of the interconnect dielectric material layer 12. A portion of the layer of metal or metal alloy, a portion of the metal nitride layer 20, and a portion of the nitridized dielectric surface layer 16 remain inside each opening 14. The remaining portion of the layer of metal or metal alloy is referred to as an electrical conducting structure 22, the remaining portion of the metal nitride layer 20 is referred as a metal nitride liner 20L, and the remaining portion of the nitridized dielectric surface layer 16 is referred to as a nitridized dielectric surface 16L. In some embodiments, both the metal nitride liner 20L and the nitridized dielectric surface 16L are both U-shaped. By "U-shaped" it is meant a material that has a horizontal bottom portion and a vertical portion extending from each end of the horizontal portion. As is shown in FIG. 6, a topmost surface of each vertical portion of the U-shaped metal nitride liner 20L and each vertical portion of the U-shaped nitridized dielectric surface 16L is coplanar with a topmost surface of the electrical conducting structure 22 and the topmost surface of the interconnect dielectric material layer 12. In some embodiments in which the opening is formed entirely through the interconnect dielectric material layer 12, the metal nitride liner 20L and the nitridized dielectric surface 16L can be present only on the sidewalls of interconnect dielectric material layer 12 provided by opening 14.

Notably, FIG. 6 illustrates an example semiconductor structure of the present application. The exemplary semiconductor structure includes an interconnect dielectric material layer 12 containing an opening (not specifically labeled in FIG. 6) that exposes a nitridized dielectric surface 16L of the interconnect dielectric material layer 12. A metal nitride liner 20L is located in the opening and is directly contacting the nitridized dielectric surface 16L. An electrical conducting structure 22 is also located in the opening and is directly contacting the metal nitride liner 20L.

Figure 7:
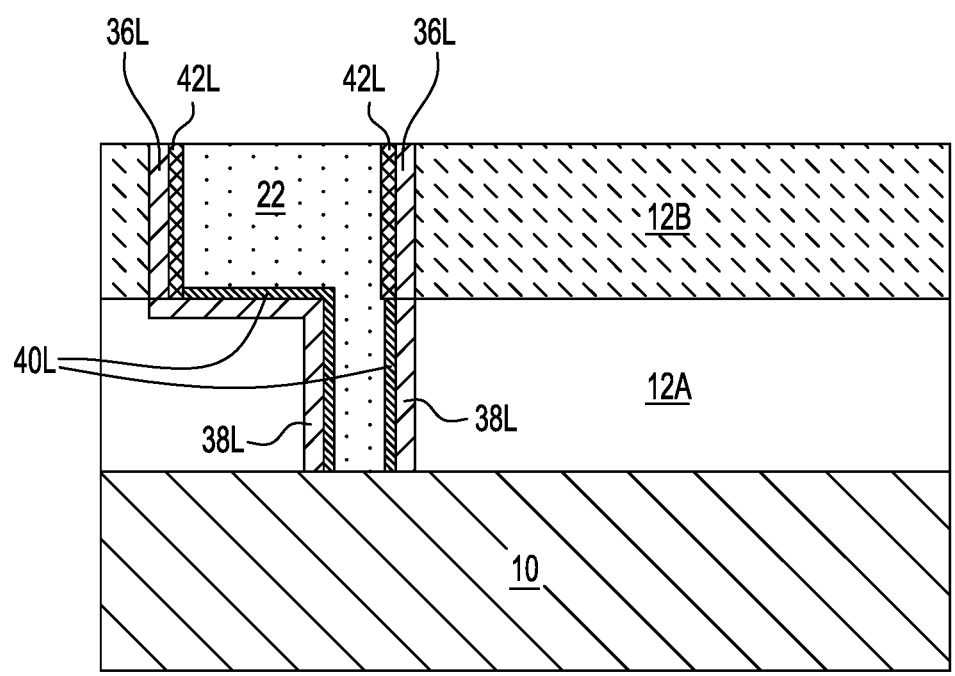
FIG. 7 is a cross sectional view of another exemplary semiconductor structure that can be formed utilizing the method of the present application.

Referring now to FIG. 7, there is illustrated another exemplary semiconductor structure that can be formed utilizing the method of the present application. In this drawing, reference numeral 10 represents a substrate, reference numeral 12A represents a first interconnect dielectric material layer having a first nitrogen content, element 12B represents a second interconnect dielectric material layer having a second nitrogen content that differs from the first nitrogen content, element 38L represents a first nitridized dielectric surface (the first dielectric surface includes a same dielectric material as the first interconnect dielectric material 12A with added nitrogen), element 36L represents a second nitridized dielectric surface (the second dielectric surface includes a same dielectric material as the second interconnect dielectric material 12B with added nitrogen), element 40L denotes a first metal nitride liner, element 42L represents a second metal nitride liner, and element 22 represents an electrical conducting structure. The electrical conducting structure 22 includes an upper portion located in a second opening formed in the second dielectric material layer 12B, and a lower portion located in a first opening formed in the first dielectric material layer 12A. In this embodiment, the first and second openings are in communication with each other.

Due to the process of the present application, the nitrogen content of the first nitridized dielectric surface 38L is greater than the first nitrogen content of the first interconnect dielectric material layer 12A, and the nitrogen content of the second nitridized dielectric surface 36L is greater than the second nitrogen content of the second interconnect dielectric material layer 12B. Moreover, the first metal nitride liner 40L has a first thickness, while the second metal nitride liner 42L has a second thickness that differs from the first thickness.

In one example (as is shown in FIG. 7) and when the first nitrogen content is less than the second nitrogen content, the second thickness of the second metal nitride liner 42L that is formed is greater than the first thickness of the first metal nitride liner 40L that is formed. In another example (not shown) and when the first nitrogen content is greater than the second nitrogen content, the second thickness of the second metal nitride liner 42L that is formed is less than the first thickness of the first metal nitride liner 40L that is formed. This embodiment illustrates that the thickness of a metal nitride liner that is formed utilizing the method of the present application is dependent on initial nitrogen content of the interconnect dielectric material layer.

FIG. 7 shows another exemplary semiconductor structure of the present application. The exemplary semiconductor structure may include a first interconnect dielectric material layer 12A of a first nitrogen content and containing a first opening that exposes a first nitridized dielectric surface 38L of the first interconnect dielectric material layer 12A, the first nitridized dielectric surface 38L having a higher nitrogen content than the first nitrogen content of the first dielectric material layer 12A. A second interconnect dielectric material layer 12B of a second nitrogen content that differs from the first nitrogen content is located on a surface of the first dielectric material layer 12A, the second interconnect dielectric layer 12B contains a second opening that is in communication with the first opening and that exposes a second nitridized dielectric surface 36L of the second interconnect dielectric material layer 12B, the second nitridized dielectric surface 36L having a higher nitrogen content than the second nitrogen content of the second dielectric material layer 12B. A first metal nitride liner 40L is located in the first opening and directly contacting the first nitridized dielectric surface 38L, and a second metal nitride liner 42L is located in the second opening and directly contacting the second nitridized dielectric surface 36L. An electrical conducting structure 22 is present in the first and second openings, wherein a lower portion of the electrical conducting structure 22 is in the first opening and directly contacting the first metal nitride liner 40L, and an upper portion of the electrical conducting structure 22 is in the second opening and directly contacting the second metal nitride liner 42L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an interconnect dielectric material layer having an opening only partially formed through the interconnect dielectric material layer, wherein the opening contains a metal nitride liner and an electrical conducting structure embedded therein, wherein a nitridized dielectric surface of the interconnect dielectric material layer is located entirely along sidewall surfaces and entirely along a bottommost surface of the metal nitride liner so as to entirely separate the metal nitride liner from the interconnect dielectric material layer and the metal nitride liner is located entirely between the electrical conducting structure and the nitridized dielectric surface of the interconnect dielectric material layer.

2. The semiconductor structure of claim 1, wherein the electrical conducting structure has a topmost surface that is coplanar with a topmost surface of each of the metal nitride liner, the nitridized dielectric surface and the interconnect dielectric material layer.

3. The semiconductor structure of claim 2, wherein the nitridized dielectric surface is U-shaped, and the metal nitride liner is U-shaped.

4. The semiconductor structure of claim 1, wherein the nitridized dielectric surface has a higher nitrogen content than the interconnect dielectric material layer.

5. The semiconductor structure of claim 4, wherein the nitridized dielectric surface comprises a same interconnect dielectric material as the interconnect dielectric material layer.

6. The semiconductor structure of claim 5, wherein the interconnect dielectric material is composed of $SiO_2$, a silsesquioxane, a C doped oxide or a thermosetting polyarylene ether.

7. The semiconductor structure of claim 4, wherein the nitrogen content of the nitridized dielectric surface is 10 atomic percent or greater.

8. The semiconductor structure of claim 7, wherein the nitrogen content of the nitridized dielectric surface is from 10 atomic percent to 50 atomic percent.

9. The semiconductor structure of claim 4, wherein the nitrogen content of the nitridized dielectric surface is less than 10 atomic percent.

10. The semiconductor structure of claim 1, wherein the metal nitride liner has a same nitrogen content as the nitridized dielectric surface.

11. The semiconductor structure of claim 10, wherein the metal nitride liner comprises Ta, Ti, W, Co, Ru, Ir, Al or Rh.

12. The semiconductor structure of claim 1, wherein the electrical conducting structure comprises Cu, W, Al or alloys thereof.

13. The semiconductor structure of claim 1, further comprising a substrate located beneath the interconnect dielectric material layer.

14. The semiconductor structure of claim 13, wherein the substrate comprises a semiconductor material having one or more semiconductor devices located thereon.

15. The semiconductor structure of claim 1, wherein the interconnect dielectric material layer comprises an interconnect dielectric material that contains nitrogen, and wherein a nitrogen gradient is present between the nitridized dielectric surface and the interconnect dielectric material layer.

16. The semiconductor structure of claim 15, wherein the nitridized dielectric surface has a nitrogen content of 10 atomic percent or greater.

17. The semiconductor structure of claim 16, wherein the nitrogen content of the nitridized dielectric surface is from 10 atomic percent to 50 atomic percent.

18. The semiconductor structure of claim 15, wherein the nitridized dielectric surface has a nitrogen content of less than 10 atomic percent.

* * * * *